United States Patent
Xiang et al.

(10) Patent No.: US 12,183,576 B2
(45) Date of Patent: Dec. 31, 2024

(54) PREPARATION METHOD FOR SEMICONDUCTOR STRUCTURE

(71) Applicant: ENKRIS SEMICONDUCTOR, INC., Suzhou (CN)

(72) Inventors: Peng Xiang, Suzhou (CN); Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 140 days.

(21) Appl. No.: 17/968,981

(22) Filed: Oct. 19, 2022

(65) Prior Publication Data
US 2023/0038176 A1  Feb. 9, 2023

Related U.S. Application Data

(63) Continuation of application No. PCT/CN2020/110688, filed on Aug. 24, 2020.

(51) Int. Cl.
*C30B 25/04* (2006.01)
*C30B 25/18* (2006.01)
(Continued)

(52) U.S. Cl.
CPC ........ *H01L 21/02694* (2013.01); *C30B 25/04* (2013.01); *C30B 25/183* (2013.01);
(Continued)

(58) Field of Classification Search
CPC ..... C30B 25/04; C30B 25/183; C30B 25/186; C30B 29/406; H01L 21/02378;
(Continued)

(56) References Cited

U.S. PATENT DOCUMENTS

2004/0009643 A1* 1/2004 Blanchard ........... H01L 29/7802
257/E29.066
2013/0037878 A1* 2/2013 Wang .................. H01L 29/0634
257/329
(Continued)

FOREIGN PATENT DOCUMENTS

CN  102386067 A  3/2012
CN  103035698 A  4/2013
(Continued)

OTHER PUBLICATIONS

European Patent Office, English computer translation of CN-107305839 (Year: 2024).*
(Continued)

*Primary Examiner* — Matthew J Song
(74) *Attorney, Agent, or Firm* — Westbridge IP LLC

(57) ABSTRACT

Disclosed is a preparation method for a semiconductor structure. The semiconductor structure includes: a substrate; an epitaxial layer and an epitaxial structure that are stacked on the substrate in sequence. The epitaxial layer is doped with a doping element. In the forming process, a sacrificial layer is formed on the epitaxial layer, and the sacrificial layer is repeatedly etched, such that a concentration of the doping element in the epitaxial layer is lower than a preset value. In this application, the sacrificial layer is formed on the epitaxial layer, and the sacrificial layer is repeatedly etched, such that the concentration of the doping element in the epitaxial layer is lower than the preset value, so as to prevent the doping element in the epitaxial layer from being precipitated upward into an upper-layer structure, ensure the mobility of electrons in a channel layer, and improve the performance of a device.

16 Claims, 9 Drawing Sheets

(51) Int. Cl.
    *C30B 29/40*     (2006.01)
    *H01L 21/02*     (2006.01)

(52) U.S. Cl.
    CPC .......... *C30B 25/186* (2013.01); *C30B 29/406* (2013.01); *H01L 21/02378* (2013.01); *H01L 21/02381* (2013.01); *H01L 21/02389* (2013.01); *H01L 21/0242* (2013.01); *H01L 21/02458* (2013.01); *H01L 21/0254* (2013.01); *H01L 21/02576* (2013.01); *H01L 21/0262* (2013.01)

(58) Field of Classification Search
    CPC ......... H01L 21/02381; H01L 21/02389; H01L 21/0242; H01L 21/02458; H01L 21/02502; H01L 21/02505; H01L 21/0254; H01L 21/02573; H01L 21/02576; H01L 21/0262; H01L 21/02694; H01L 29/778
    See application file for complete search history.

(56) References Cited

U.S. PATENT DOCUMENTS

| | | | |
|---|---|---|---|
| 2013/0075786 A1* | 3/2013 | Ishiguro | ............ H01L 21/02458 257/E29.246 |
| 2013/0109134 A1 | 5/2013 | Hatakenaka et al. | |
| 2013/0145984 A1* | 6/2013 | Zhang | ................... C30B 25/186 117/106 |
| 2014/0239311 A1* | 8/2014 | Kawai | ................. H01L 29/7789 257/76 |
| 2017/0077300 A1* | 3/2017 | Lee | ................... H01L 29/66795 |
| 2017/0170283 A1* | 6/2017 | Laboutin | ........... H01L 21/02458 |

FOREIGN PATENT DOCUMENTS

| | | | | |
|---|---|---|---|---|
| CN | 104143503 A | | 11/2014 | |
| CN | 104617160 A | * | 5/2015 | |
| CN | 107305839 A | * | 10/2017 | ....... H01L 21/02436 |

OTHER PUBLICATIONS

European Patent Office, English computer translation of CN-104617160 (Year: 2024).*

International Search Report issued in corresponding PCT Application No. PCT/CN2020/110688, dated May 27, 2021.

Written Opinion issued in corresponding PCT Application No. PCT/CN2020/110688, dated May 27, 2021.

* cited by examiner

PREPARATION METHOD FOR SEMICONDUCTOR STRUCTURE

CROSS-REFERENCE TO RELATED APPLICATIONS

This application is a continuation of International Application No. PCT/CN2020/110688, filed on Aug. 24, 2020, the entire contents of which are incorporated herein by reference.

TECHNICAL FIELD

This application relates to the semiconductor field, and in particular, to a preparation method for a semiconductor structure.

BACKGROUND

In the preparation of a semiconductor device, GaN power electronics and radio frequency materials used are often doped with an element such as iron or magnesium, to increase the resistivity of an epitaxial layer and reduce electrical leakage of the epitaxial layer. However, iron and magnesium have the so-called memory effect, that is, the doping element iron or magnesium in the epitaxial layer is precipitated upward into an upper-layer epitaxial structure. Consequently, the upper-layer structure that does not need to be doped also has a large amount of doping element iron or magnesium, which reduces the electron mobility of the upper-layer epitaxial structure, and thereby reduces the performance of the device.

Therefore, how to prevent the doping element in the epitaxial layer from being precipitated upward into the upper-layer structure is a difficult problem to be resolved urgently at present.

SUMMARY

This application provides a preparation method for a semiconductor structure, so as to prevent a doping element in a first epitaxial structure from being precipitated upward into an upper-layer epitaxial structure, ensure the electron mobility of the upper-layer epitaxial structure, and improve the performance of a device.

To achieve the foregoing objective, according to an embodiment of this application, a preparation method for a semiconductor structure is provided. The preparation method includes the following steps:

S1: forming a first epitaxial structure on a substrate, where the first epitaxial structure is doped with a doping element;

S2: forming a sacrificial layer on the first epitaxial structure;

S3: etching the sacrificial layer; and

S4: continuing to grow a second epitaxial structure on the first epitaxial structure on which the sacrificial layer has been etched.

Before step S4, steps S2 and S3 are repeated multiple times until the concentration of the doping element in the first epitaxial structure is lower than a preset value.

Optionally, the first epitaxial structure is a buffer layer, the doping element is in the buffer layer; and the second epitaxial structure includes at least a channel layer and a barrier layer that are stacked in sequence.

Optionally, the first epitaxial structure includes a buffer layer, a first N-type semiconductor layer, a second N-type semiconductor layer, and a P-type semiconductor layer that are stacked in sequence, the doping element is in the P-type semiconductor layer; and the second epitaxial structure includes at least a third N-type semiconductor layer.

Optionally, the first epitaxial structure includes at least a buffer layer and a first P-type semiconductor layer that are stacked in sequence, the doping element is in the P-type semiconductor layer; and the second epitaxial structure includes at least an N-type semiconductor layer and a second P-type semiconductor layer that are stacked in sequence.

Optionally, the first N-type semiconductor layer is an N-type heavily doped GaN layer; the second N-type semiconductor layer is an N-type lightly doped GaN layer; and the third N-type semiconductor layer is an N-type heavily doped GaN layer.

Optionally, the first P-type semiconductor layer is a P-type GaN layer; the N-type semiconductor layer is an N-type GaN layer; and the second P-type semiconductor layer is a P-type GaN layer.

Optionally, a material of the sacrificial layer includes a combination of one or more of InN, InGaN, InAlN, InAlGaN, and GaN.

Optionally, the thickness of the sacrificial layer ranges from 1 nm to 1 μm.

Optionally, a protective layer is further included between the first epitaxial structure and the sacrificial layer.

Optionally, a material of the protective layer includes a combination of one or more of AlN, AlInGaN, and AlGaN.

Optionally, the doping element in the first epitaxial structure is iron or magnesium.

Optionally, the preset value is below the level of $2 \times 10^{18}$ atoms/cm$^3$.

Optionally, steps S1, S2, S3, and S4 are sequentially completed in a same reaction chamber.

Optionally, in step S3, the temperature in the reaction chamber is higher than 400 degrees Celsius, and the sacrificial layer is etched using a gas.

Optionally, the gas is one or a combination of more of hydrogen, ammonia, hydrogen chloride, and chlorine.

Optionally, in step S3, the sacrificial layer is completely or partially etched.

Optionally, the substrate may be Si, SiC, GaN, AlN, or sapphire.

In the preparation method for a semiconductor structure in the foregoing embodiment, the sacrificial layer is formed on the first epitaxial structure, and the sacrificial layer is etched, such that the concentration of the doping element in the first epitaxial structure is lower than the preset value, so as to prevent the doping element in the first epitaxial structure from being precipitated upward into an upper-layer epitaxial structure, ensure the mobility of electrons in the upper-layer epitaxial structure, and improve the performance of a device.

Specifically, by forming the sacrificial layer on the first epitaxial structure to enable iron or magnesium dopant atoms in the first epitaxial structure to be precipitated and gathered on a surface of the sacrificial layer in contact with the first epitaxial structure and in the sacrificial layer and then etching the sacrificial layer, iron or magnesium dopant atoms precipitated upward into the upper-layer epitaxial structure can be reduced or eliminated. Although the dopant atoms are also gathered on the surface of the first epitaxial structure due to surface energy, directly etching the first epitaxial structure may cause defects in the first epitaxial structure. In addition, a material of the first epitaxial structure is also relatively difficult to etch. Further, to reduce the damage to the first epitaxial structure in the etching process, the present disclosure further proposes growing the protective layer on the first epitaxial structure before the sacrificial layer is grown, where a material of the protective layer is a combination of one or more of AlN, AlInGaN, and AlGaN.

DETAILED DESCRIPTION OF THE EMBODIMENTS

Figure 1:
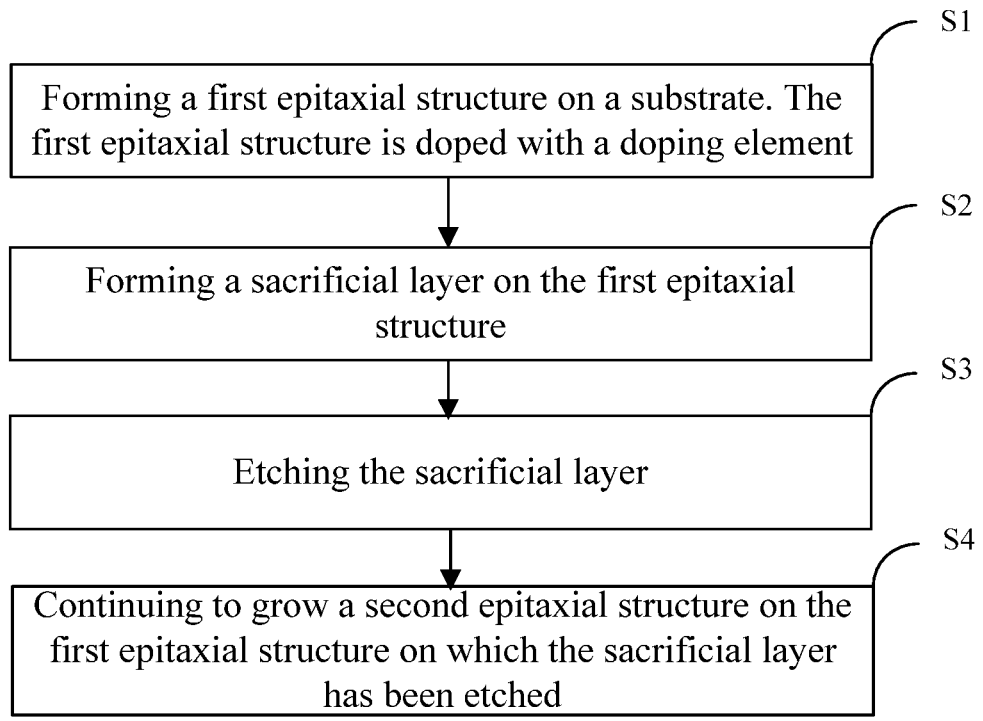
FIG. 1 is a flowchart of a preparation method for a semiconductor structure.

Herein, exemplary embodiments will be described in detail, and examples thereof are shown in the accompanying drawings. When the following description refers to the accompanying drawings, unless otherwise indicated, the same reference numerals in different drawings indicate the same or similar elements. Implementations described in the following exemplary embodiments do not represent all implementations consistent with this application. On the contrary, they are merely examples of an apparatus consistent with some aspects of this application as described in detail in the appended claims.

Terms used in this application are merely for the purpose of describing specific embodiments, and are not intended to limit this application. Unless otherwise defined, the technical terms or scientific terms used in this application should have general meanings understood by persons of ordinary skill in the art to which this application pertains. "A" or "an" or like words used in the specification of this application and the claims do not indicate a quantitative limitation, but indicate at least one. "Include" or "comprise" or like words mean that an element or item preceding "include" or "comprise" now covers elements or items and their equivalents listed following "include" or "comprise", without excluding other elements or items. "Connect" or "connected" or like words are not limited to a physical or mechanical connection, but may include an electrical connection, whether direct or indirect. "A plurality of" includes two and is equivalent to at least two. The singular forms of "a/an", "said", and "the" used in the specification of this application and the appended claims are also intended to include plural forms, unless the context clearly implies otherwise. It should also be understood that the term "and/or" used herein refers to and includes any or all possible combinations of one or more associated listed items.

Embodiment 1

This embodiment provides a preparation method for a semiconductor structure. As shown in FIG. 1, the preparation method for a semiconductor structure includes the following steps:

S1: forming a first epitaxial structure on a substrate. The first epitaxial structure is doped with a doping element;

S2: forming a sacrificial layer on the first epitaxial structure;

S3: etching the sacrificial layer; and

S4: continuing to grow a second epitaxial structure on the first epitaxial structure on which the sacrificial layer has been etched.

Before step S4, steps S2 and step S3 are repeated multiple times until the concentration of the doping element in the first epitaxial structure is lower than a preset value.

In this way, by forming the sacrificial layer on the first epitaxial structure and etching the sacrificial layer, the concentration of the doping element in the first epitaxial structure is lower than the preset value, so as to prevent the doping element in the first epitaxial structure from being precipitated upward into an upper-layer epitaxial structure, ensure the mobility of electrons in the upper-layer epitaxial structure, and improve the performance of a device. To be specific, by forming the sacrificial layer on the first epitaxial structure to enable iron or magnesium dopant atoms to be gathered on a surface of the sacrificial layer in contact with the first epitaxial structure and in the sacrificial layer and then etching the sacrificial layer, iron or magnesium dopant atoms precipitated upward into the upper-layer epitaxial structure can be reduced or eliminated.

In the preparation method for a semiconductor structure of this embodiment, the first epitaxial structure is a buffer layer, and the second epitaxial structure includes at least a channel layer and a barrier layer. Each step specifically includes the following.

Figure 2A:
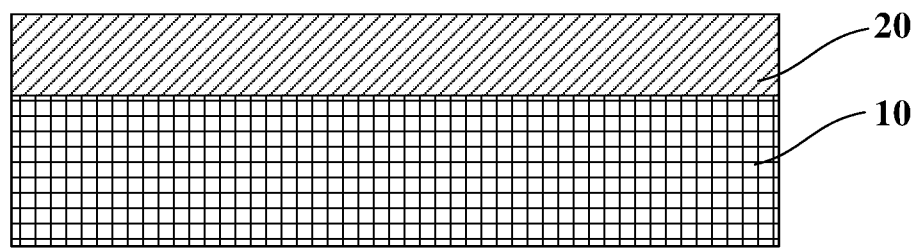
FIG. 2(a) to FIG. 2(f) are diagrams showing a preparation method for a semiconductor structure and a process flow of the preparation method for a semiconductor structure according to Embodiment 1 of this application.

In step S1, as shown in FIG. 2(a), a buffer layer 20 is formed on a substrate 10, and the buffer layer 20 is doped with a doping element. The doping element in the buffer layer 20 is iron or magnesium, and the buffer layer 20 is a group III nitride epitaxial layer. A material of the substrate 10 includes Si, SiC, GaN, AlN, or sapphire.

Figure 2B:
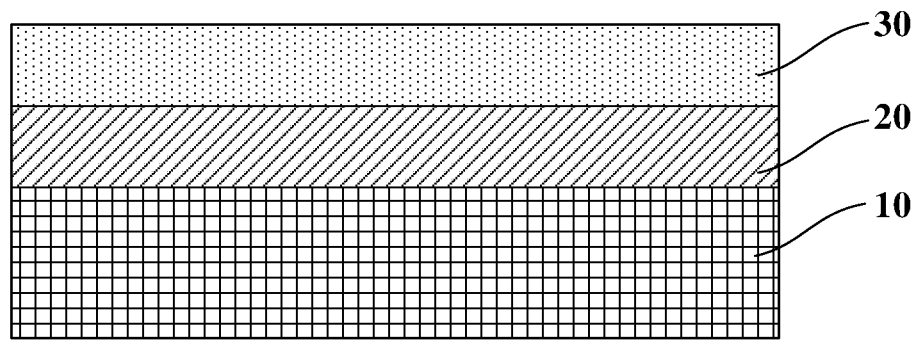

In step S2, as shown in FIG. 2(b), a sacrificial layer 30 is formed on the buffer layer 20, such that iron or magnesium dopant atoms in the buffer layer 20 are precipitated and gathered on a surface of the sacrificial layer 30 in contact with the buffer layer 20 and in the sacrificial layer 30. A material of the sacrificial layer 30 includes a combination of one or more of InN, InGaN, InAlN, InAlGaN, and GaN, and has a thickness ranging from 1 nm to 1 μm.

Figure 2C:
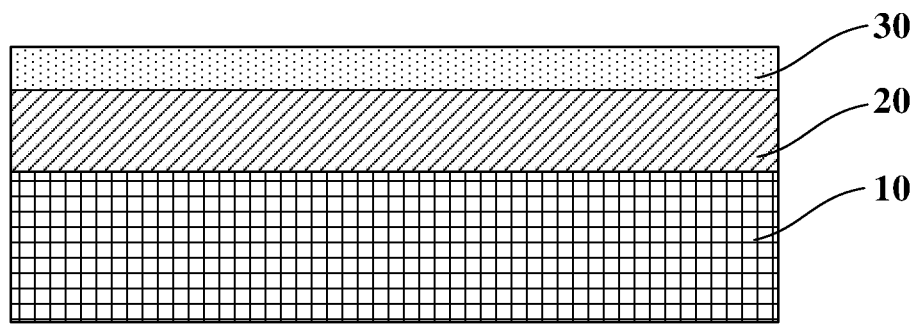

In step S3, as shown in FIG. 2(c), the sacrificial layer 30 is etched, so that the iron or magnesium dopant atoms precipitated in the sacrificial layer 30 are taken away together, and the content of the doping element enriched on the surface of the buffer layer 20 is reduced. Preferably, the temperature in a reaction chamber is higher than 400 degrees Celsius, so as to directly etch the sacrificial layer in the reaction chamber without using other tools or etching methods. The sacrificial layer 30 is etched by using a gas, and the gas for etching is preferably one or a combination of more of hydrogen, ammonia, hydrogen chloride, and chlorine.

In step S4, a channel layer 40 and a barrier layer 50 are formed on the buffer layer 20 on which the sacrificial layer 30 has been etched.

In step S1, a protective layer may further be included between the substrate 10 and the buffer layer 20, and a material of the protective layer is a combination of one or more of AlN, AlInGaN, and AlGaN.

In step S3, there are two cases after the sacrificial layer 30 has been etched. In a first case, as shown in FIG. 2(c), part of the sacrificial layer 30 is left on the buffer layer; and in a second case, as shown in FIG. 2(e), all of the sacrificial layer 30 has been etched away.

Figure 2D:
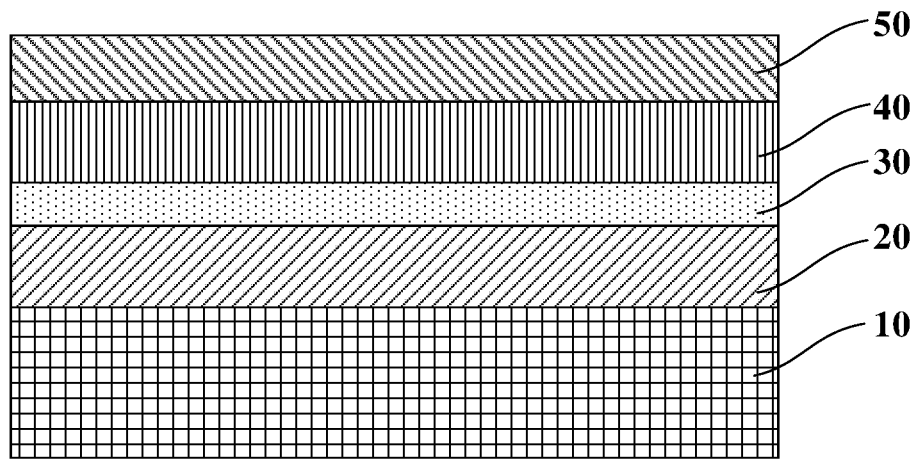
Figure 2E:
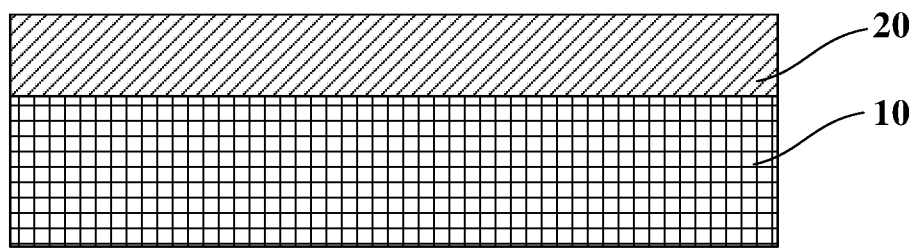
Figure 2F:
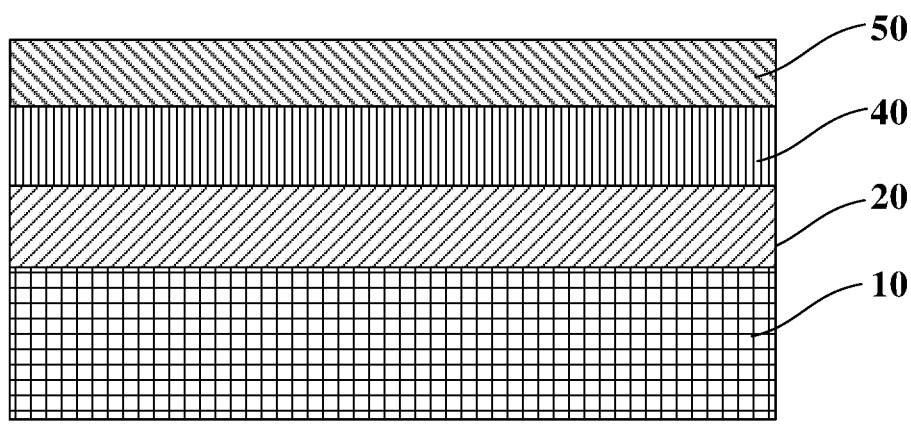

Correspondingly, in the first case, in step S4, as shown in FIG. 2(d), the channel layer 40 and the barrier layer 50 are formed on the remaining sacrificial layer 30; and in the second case, as shown in FIG. 2(f), the channel layer 40 and the barrier layer 50 are directly formed on the buffer layer 20.

Before step S4, steps S2 and S3 are repeated multiple times for the doping element until the concentration of the doping element in the buffer layer 20 is lower than the preset value. The preset value is defined based on different requirements for device parameters, and then the number of times for which steps S2 and S3 need to be repeated is determined based on the preset value. Preferably, the number N of times for which steps S2 and S3 are repeated is less than or equal to 100,000.

Step S1, step S2, step S3, and step S4 are completed sequentially in the same reaction chamber, and the epitaxial material does not need to be moved out of the reaction chamber throughout this process. This can improve the preparation efficiency and a yield of finished product, while avoiding the risk of the surface of the epitaxial material being contaminated by external impurities because the epitaxial material is moved out of the reaction chamber.

In this way, the sacrificial layer is formed on the buffer layer, and the sacrificial layer is etched, such that the concentration of the doping element in the buffer layer is lower than the preset value, so as to prevent the doping element in the buffer layer from being precipitated upward into an upper-layer structure, ensure the mobility of electrons in a channel layer, and improve the performance of a device.

Specifically, by forming the sacrificial layer on the buffer layer enable iron or magnesium dopant atoms to be gathered on a surface of the sacrificial layer in contact with the buffer layer and in the sacrificial layer and then etching the sacrificial layer, iron or magnesium dopant atoms precipitated upward into the upper-layer structure can be reduced or eliminated.

Embodiment 2

Preparation steps of a preparation method for a semiconductor structure of this embodiment are basically the same as the preparation steps in Embodiment 1, except that the first epitaxial structure includes a buffer layer, a first N-type semiconductor layer, a second N-type semiconductor layer, and a P-type semiconductor layer that are stacked in sequence, and the doping element is in the P-type semiconductor layer. The second epitaxial structure includes at least a third N-type semiconductor layer.

Figure 3A:
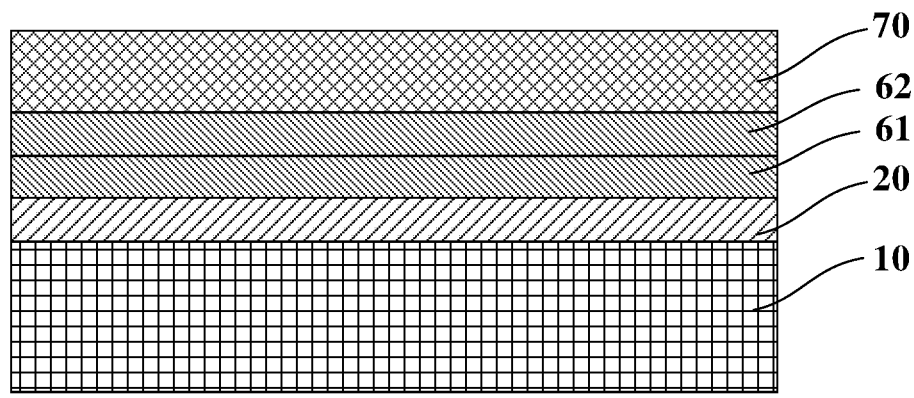
FIG. 3(a) to FIG. 3(f) are diagrams showing a preparation method for a semiconductor structure and a process flow of the preparation method for a semiconductor structure according to Embodiment 2 of this application.

In step S1, as shown in FIG. 3(a), a first epitaxial structure including a buffer layer 20, a first N-type semiconductor layer 61, a second N-type semiconductor layer 62, and a P-type semiconductor layer 70 sequentially formed on the substrate, the P-type semiconductor layer 70 is doped with a doping element, where the P-type semiconductor layer 70 is doped with a doping element and the doping element in the P-type semiconductor layer 70 is iron or magnesium, and the buffer layer 20 is a group III nitride epitaxial structure.

Figure 3B:
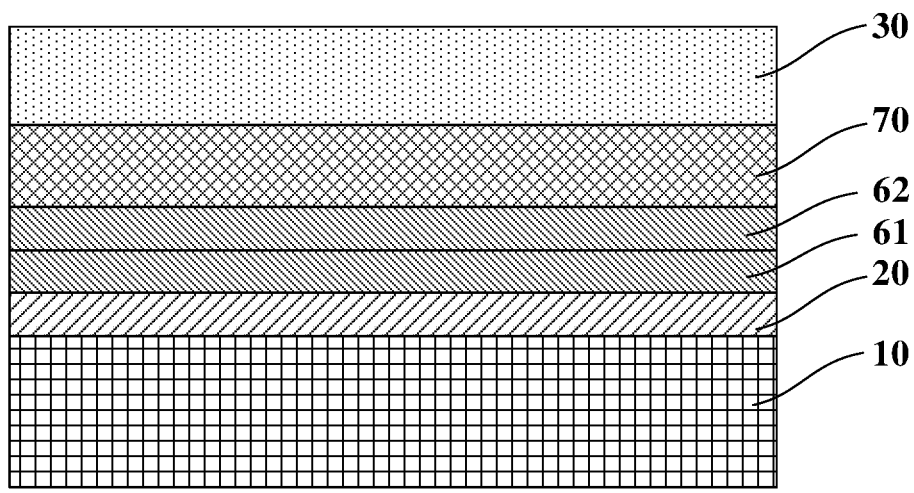

In step S2, as shown in FIG. 3(b), a sacrificial layer 30 is formed on the P-type semiconductor layer 70, such that iron or magnesium dopant atoms in the P-type semiconductor layer 70 are precipitated and gathered on a surface of the sacrificial layer 30 in contact with the P-type semiconductor layer 70. A material of the sacrificial layer 30 includes one or a combination of more of InN, InGaN, InAlN, InAlGaN, and GaN, and has a thickness ranging from 1 nm to 1 μm.

Figure 3C:
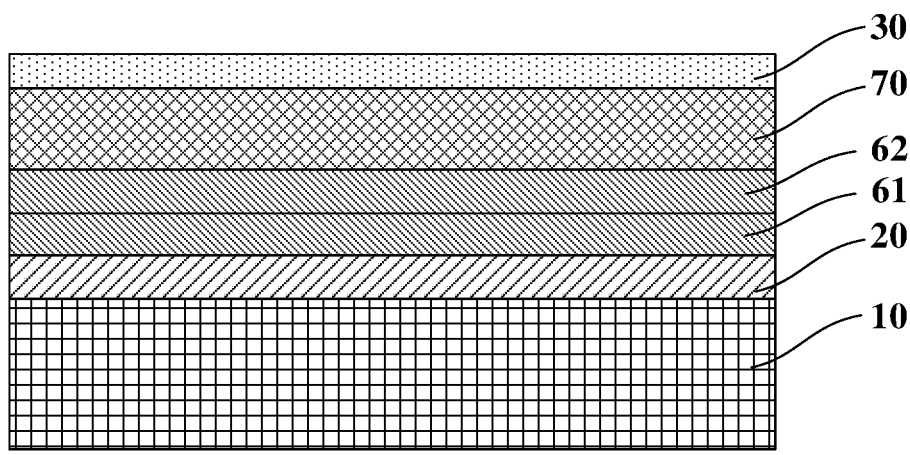

In step S3, as shown in FIG. 3(c), the sacrificial layer 30 is etched, so that the iron or magnesium dopant atoms precipitated in the sacrificial layer 30 are taken away together, and the content of the doping element enriched on the surface of the P-type semiconductor layer 70 is reduced. Preferably, the temperature in a reaction chamber is higher than 400 degrees Celsius, so as to directly etch the sacrificial layer in the reaction chamber without using other tools or etching methods. The sacrificial layer 30 is etched by using a gas, and the gas for etching is preferably one or a combination of more of hydrogen, ammonia, hydrogen chloride, and chlorine.

Figure 3D:
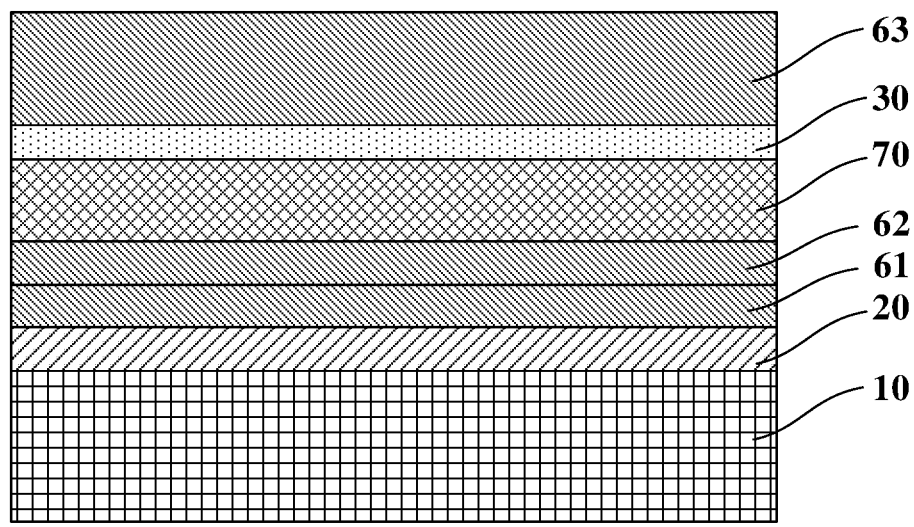

In step S4, as shown in FIG. 3(d), a third N-type semiconductor layer 63 is formed on the P-type semiconductor layer 70 on which the sacrificial layer 30 has been etched.

The first N-type semiconductor layer 61 is an N-type heavily doped GaN layer; the second N-type semiconductor layer 62 is an N-type lightly doped GaN layer; the P-type semiconductor layer 70 is a P-type GaN layer; and the third N-type semiconductor layer 63 is an N-type heavily doped GaN layer.

Figure 3E:
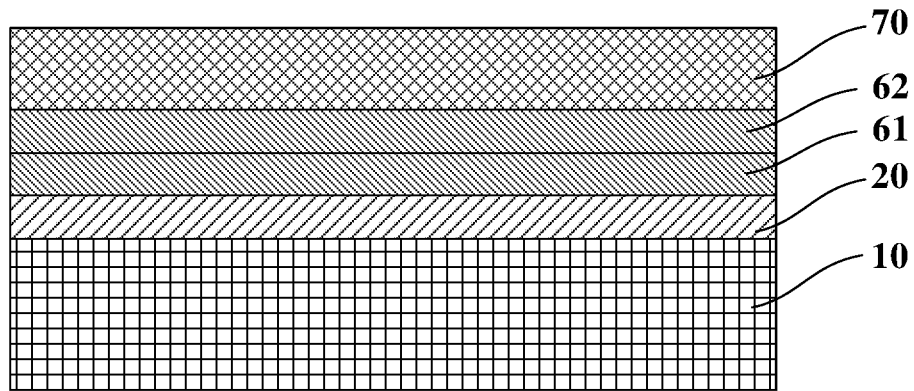

Same as the Embodiment 1, in step S3, there are two cases after the sacrificial layer 30 has been etched. In a first case, as shown in FIG. 3(c), part of the sacrificial layer 30 is left on the P-type semiconductor layer 70; and in a second case, as shown in FIG. 3(e), all of the sacrificial layer 30 has been etched away.

Figure 3F:
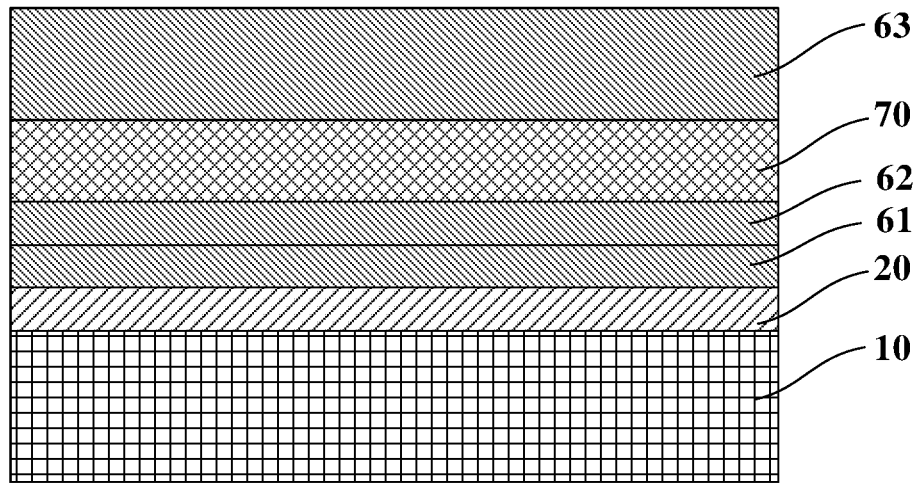

Correspondingly, in the first case, in step S4, as shown in FIG. 3(d), the third N-type semiconductor layer 63 is formed on the remaining sacrificial layer 30; and in the second case, as shown in FIG. 3(f), the third N-type semiconductor layer 63 is directly formed on the P-type semiconductor layer 70.

Before step S4, steps S2 and S3 are repeated multiple times until the concentration of the doping element in the P-type semiconductor layer 70 is lower than the preset value. The preset value is defined based on different requirements for device parameters, and then the number of times for which steps S2 and S3 need to be repeated is determined based on the preset value. Preferably, the number N of times for which steps S2 and S3 are repeated is less than or equal to 100,000.

Step S1, step S2, step S3, and step S4 are completed sequentially in the same reaction chamber, and the epitaxial material does not need to be moved out of the reaction chamber during this process. This can improve the preparation efficiency and a yield of product, while avoiding the risk of the surface of the epitaxial material being contaminated by external impurities because the epitaxial material is moved out of the reaction chamber.

In this way, by forming the sacrificial layer on the P-type semiconductor layer 70, and etching the sacrificial layer to enable the concentration of the doping element in the P-type semiconductor layer 70 to be lower than the preset value, the doping element in the P-type semiconductor layer 70 is prevented from being precipitated upward into an upper-layer structure, ensuring the mobility of electrons in a channel layer, and improving the performance of a device.

Specifically, by forming the sacrificial layer on the P-type semiconductor layer 70 to enable iron or magnesium dopant atoms to be gathered on a surface of the sacrificial layer 30 in contact with the P-type semiconductor layer 70 and then etching the sacrificial layer, iron or magnesium dopant atoms precipitated upward into the upper-layer structure can be reduced or eliminated.

Embodiment 3

Preparation steps of a preparation method for a semiconductor structure of this embodiment are basically the same as the preparation steps in Embodiment 1, except that:

the first epitaxial structure includes at least a buffer layer and a first P-type semiconductor layer that are stacked in sequence, and the doping element is in the P-type semiconductor layer. The second epitaxial structure includes at least an N-type semiconductor layer and a second P-type semiconductor layer that are stacked in sequence.

Figure 4A:
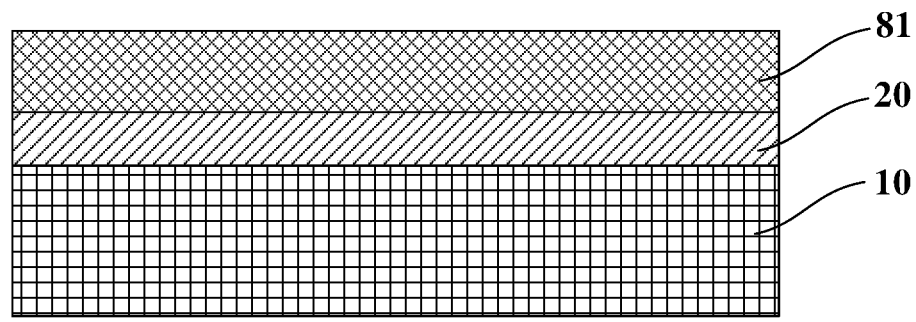
FIG. 4(a) to FIG. 4(f) are diagrams showing a preparation method for a semiconductor structure and a process flow of the preparation method for a semiconductor structure according to Embodiment 3 of this application.

Details are as follows:

In step S1, as shown in FIG. 4(a), a first epitaxial structure is formed on the substrate 10. The first epitaxial structure includes a buffer layer 20 and a first P-type semiconductor layer 81. The buffer layer 20 is a group III nitride epitaxial layer, the first P-type semiconductor layer 81 is doped with a doping element, and the doping element is iron or magnesium.

Figure 4B:
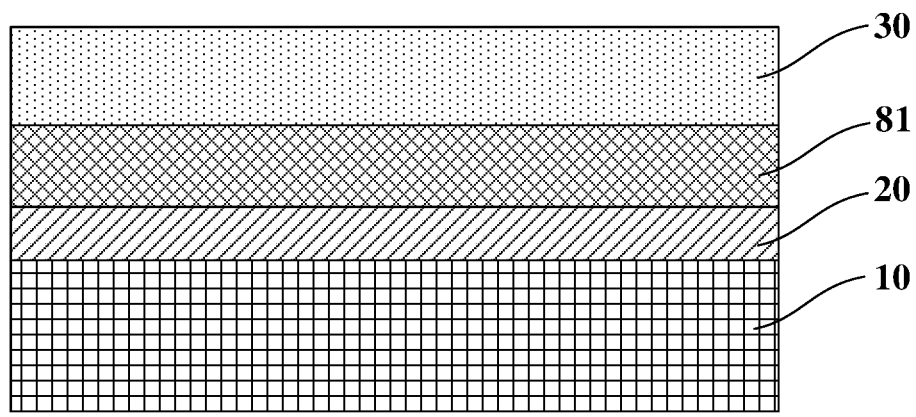

In step S2, as shown in FIG. 4(b), a sacrificial layer 30 is formed on the first P-type semiconductor layer 81, such that iron or magnesium dopant atoms in the first P-type semiconductor layer 81 are precipitated and gathered on a surface of the sacrificial layer 30 in contact with the first P-type semiconductor layer 81 and in the sacrificial layer 30. A material of the sacrificial layer 30 includes one or a combination of more of InN, InGaN, InAlN, InAlGaN, and GaN, and has a thickness ranging from 1 nm to 1 μm.

Figure 4C:
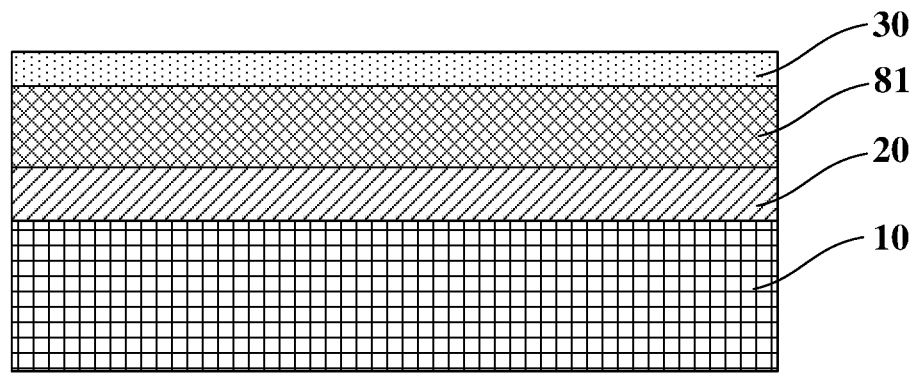

In step S3, as shown in FIG. 4(c), the sacrificial layer 30 is etched, so that the iron or magnesium dopant atoms precipitated in the sacrificial layer 30 are taken away together, and the content of the doping element gathered on the surface of the first P-type semiconductor layer 81 is reduced. Preferably, the temperature in a reaction chamber is higher than 400 degrees Celsius, so as to directly etch the sacrificial layer in the reaction chamber without using other tools or etching methods. The sacrificial layer 30 is etched by using a gas, and the gas for etching is preferably one or a combination of more of hydrogen, ammonia, hydrogen chloride, and chlorine.

Figure 4D:
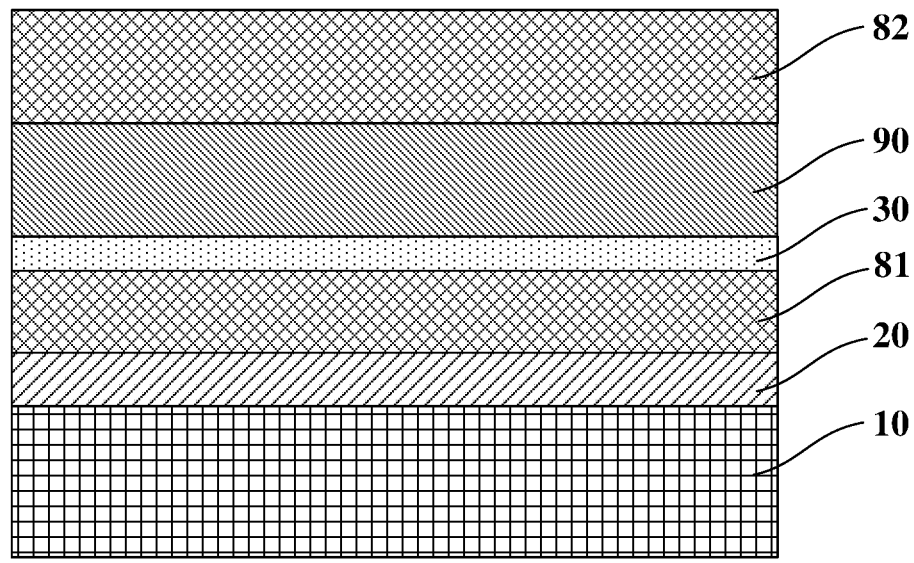

In step S4, as shown in FIG. 4(d), an N-type semiconductor layer 90 and a second P-type semiconductor layer 82 are sequentially formed on the first P-type semiconductor layer 81 on which the sacrificial layer 30 has been etched.

The first P-type semiconductor layer 81 is a P-type GaN layer; the N-type semiconductor layer 90 is an N-type GaN layer; and the second P-type semiconductor layer 82 is a P-type GaN layer.

Figure 4E:
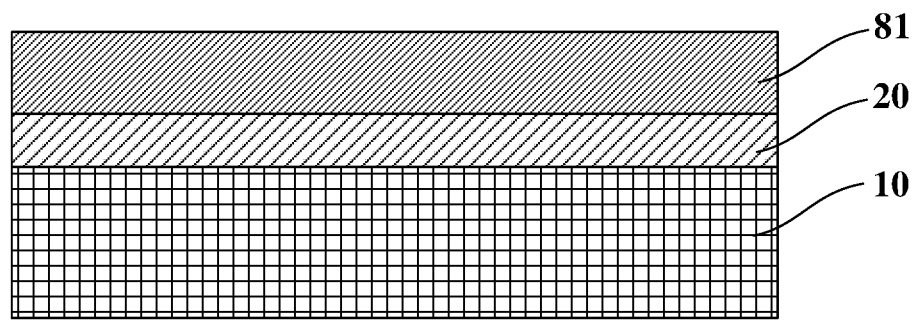

Same as the Embodiment 1, in step S3, there are two cases after the sacrificial layer 30 has been etched. In a first case, as shown in FIG. 4(c), part of the sacrificial layer 30 is left on the first P-type semiconductor layer 81; and in a second case, as shown in FIG. 4(e), all of the sacrificial layer 30 has been etched away.

Figure 4F:
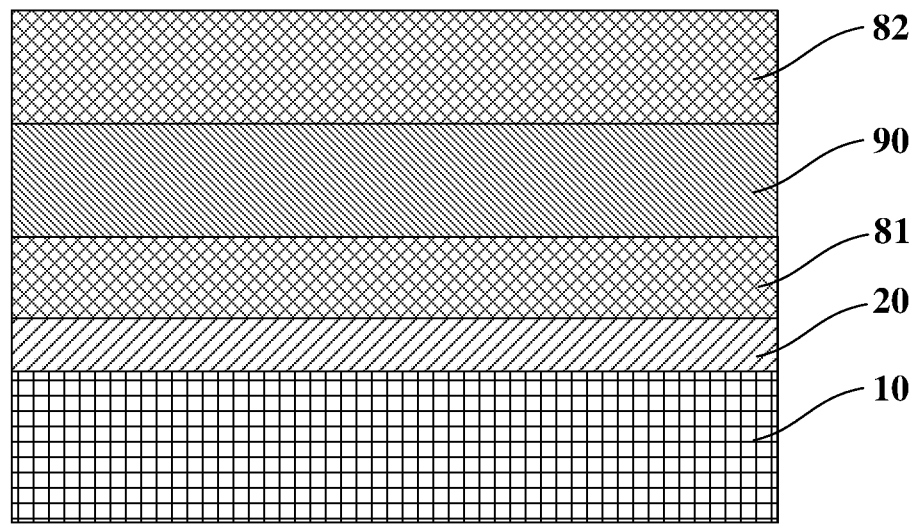

Correspondingly, in the first case, in step S4, as shown in FIG. 4(d), the N-type semiconductor layer 90 is formed on the remaining sacrificial layer 30; and in the second case, as shown in FIG. 4(f), the N-type semiconductor layer 90 is directly formed on the first P-type semiconductor layer 81.

Before step S4, steps S2 and S3 are repeated multiple times until the concentration of the doping element in the first P-type semiconductor layer 81 is lower than the preset value. The preset value is defined based on different requirements for device parameters, and then the number of times for which steps S2 and S3 need to be repeated is determined based on the preset value. Preferably, the number N of times for which steps S2 and S3 are repeated is less than or equal to 100,000.

Step S1, step S2, step S3, and step S4 are completed sequentially in the same reaction chamber, and the epitaxial material does not need to be moved out of the reaction chamber during this process. This can improve the preparation efficiency and a yield of finished product, while avoiding the risk of the surface of the epitaxial material being contaminated by external impurities because the epitaxial material is moved out of the reaction chamber.

In this way, by forming the sacrificial layer on the first P-type semiconductor layer 81 and etching the sacrificial layer to enable the concentration of the doping element in the first P-type semiconductor layer 81 to be lower than the preset value, so as to prevent the doping element in the first P-type semiconductor layer 81 from being precipitated upward into an upper-layer structure, ensuring the mobility of electrons in a channel layer, and improving the performance of a device.

Specifically, by forming the sacrificial layer on the first P-type semiconductor layer 81 to enable iron or magnesium dopant atoms to be gathered on a surface of the sacrificial layer 30 in contact with the first P-type semiconductor layer 81 and then etching the sacrificial layer, iron or magnesium dopant atoms precipitated upward into the upper-layer structure can be reduced or eliminated. The foregoing description is only the preferred embodiments of this application and is not intended to limit this application. Any modifications, equivalent substitutions, improvements, or the like made within the spirit and principles of this application shall fall within the protection scope of this application.

What is claimed is:

1. A preparation method for a semiconductor structure, comprising:
    S1: forming a first epitaxial structure on a substrate, wherein the first epitaxial structure is doped with a doping element;
    S2: forming a sacrificial layer on the first epitaxial structure;
    S3: etching the sacrificial layer; and
    S4: continuing to grow a second epitaxial structure on the first epitaxial structure on which the sacrificial layer has been etched, wherein
    before step S4, steps S2 and S3 are repeated multiple times until the concentration of the doping element in the first epitaxial structure is lower than a preset value, wherein a material of the sacrificial layer comprises a combination of one or more of InN, InGaN, InAlN, InAlGaN, and GaN.

2. The preparation method for a semiconductor structure of claim 1, wherein the first epitaxial structure is a buffer layer, the doping element is in the buffer layer; and the second epitaxial structure comprises at least a channel layer and a barrier layer that are stacked in sequence.

3. The preparation method for a semiconductor structure of claim 1, wherein the first epitaxial structure comprises a buffer layer, a first N-type semiconductor layer, a second N-type semiconductor layer, and a P-type semiconductor layer that are stacked in sequence, the doping element is in the P-type semiconductor layer; and the second epitaxial structure comprises at least a third N-type semiconductor layer.

4. The preparation method for a semiconductor structure of claim 3, wherein the first N-type semiconductor layer is an N-type doped GaN layer; the second N-type semiconductor layer is an N-type lightly doped GaN layer; and the third N-type semiconductor layer is an N-type heavily doped GaN layer.

5. The preparation method for a semiconductor structure of claim 1, wherein the first epitaxial structure comprises at least a buffer layer and a first P-type semiconductor layer that are stacked in sequence, the doping element is in the P-type semiconductor layer; and the second epitaxial structure comprises at least an N-type semiconductor layer and a second P-type semiconductor layer that are stacked in sequence.

6. The preparation method for a semiconductor structure of claim 5, wherein the first P-type semiconductor layer is a P-type GaN layer; the N-type semiconductor layer is an N-type GaN layer; and the second P-type semiconductor layer is a P-type GaN layer.

7. The preparation method for a semiconductor structure of claim 1, wherein a thickness of the sacrificial layer ranges from 1 nm to 1 μm.

8. The preparation method for a semiconductor structure of claim 1, further comprising:
  growing a protective layer between the first epitaxial structure and the sacrificial layer.

9. The preparation method for a semiconductor structure of claim 8, wherein a material of the protective layer comprises a combination of one or more of AlN, AlInGaN, and AlGaN.

10. The preparation method for a semiconductor structure of claim 1, wherein the doping element in the first epitaxial structure is iron or magnesium; and the concentration of the doping element is constant or varies with the thickness.

11. The preparation method for a semiconductor structure of claim 1, wherein the preset value is below an order of $2 \times 10^{18}$ atoms/cm3.

12. The preparation method for a semiconductor structure of claim 1, wherein steps S1, S2, S3, and S4 are sequentially completed in a same reaction chamber.

13. The preparation method for a semiconductor structure of claim 1, wherein in step S3, the temperature in the reaction chamber is higher than 400 degrees Celsius, and the sacrificial layer is etched using a gas.

14. The preparation method for a semiconductor structure of claim 13, wherein the gas is one or a combination of more of hydrogen, ammonia, hydrogen chloride, and chlorine.

15. The preparation method for a semiconductor structure of claim 1, wherein in step S3, the sacrificial layer is completely or partially etched.

16. The preparation method for a semiconductor structure of claim 1, wherein the substrate is Si, SiC, GaN, AlN, or sapphire.

* * * * *